(12) United States Patent
Lu et al.

(10) Patent No.: US 11,728,320 B2
(45) Date of Patent: Aug. 15, 2023

(54) SEMICONDUCTOR PACKAGE

(71) Applicant: MEDIATEK Inc., Hsin-Chu (TW)

(72) Inventors: Tien-Yu Lu, Hsinchu (TW); Chu-Wei Hu, Hsinchu (TW); Hsin-Hsin Hsiao, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/726,595

(22) Filed: Apr. 22, 2022

(65) Prior Publication Data
US 2022/0246591 A1 Aug. 4, 2022

Related U.S. Application Data

(63) Continuation of application No. 17/005,528, filed on Aug. 28, 2020, now Pat. No. 11,342,316.

(60) Provisional application No. 62/961,936, filed on Jan. 16, 2020.

(51) Int. Cl.
*H01L 25/16* (2023.01)
*H01L 23/538* (2006.01)

(52) U.S. Cl.
CPC ........ *H01L 25/162* (2013.01); *H01L 23/5385* (2013.01); *H01L 23/5386* (2013.01)

(58) Field of Classification Search
CPC ............... H01L 25/162; H01L 23/5385; H01L 23/5386
USPC .......................................................... 361/740
See application file for complete search history.

(56) References Cited

U.S. PATENT DOCUMENTS

| | | | |
|---|---|---|---|
| 8,508,045 B2 | 8/2013 | Khan et al. | |
| 8,975,726 B2 | 3/2015 | Chen et al. | |
| 9,123,763 B2 | 9/2015 | Yu et al. | |
| 2004/0012085 A1 | 1/2004 | Shioga et al. | |
| 2009/0008765 A1* | 1/2009 | Yamano | H01L 25/162 257/E23.125 |
| 2009/0108431 A1 | 4/2009 | Farley | |
| 2010/0090781 A1* | 4/2010 | Yamamoto | H01L 27/016 333/167 |
| 2014/0246788 A1* | 9/2014 | Kim | H01L 25/0657 257/777 |
| 2014/0367854 A1 | 12/2014 | Zhao et al. | |
| 2015/0179616 A1 | 6/2015 | Lin et al. | |
| 2018/0061807 A1 | 3/2018 | Lee | |
| 2019/0116670 A1 | 4/2019 | Anderson et al. | |
| 2020/0303482 A1 | 9/2020 | Kishimoto et al. | |

FOREIGN PATENT DOCUMENTS

| | | |
|---|---|---|
| EP | 1962342 A1 | 8/2008 |
| EP | 3104409 A2 | 12/2016 |

OTHER PUBLICATIONS

EP Search Report dated Oct. 16, 2020 in EP application (No. 20196116.6-1212).

* cited by examiner

*Primary Examiner* — Andargie M Aychillhum
(74) *Attorney, Agent, or Firm* — McClure, Qualey & Rodack, LLP

(57) ABSTRACT

A semiconductor package includes a first substrate, a second substrate, a conductive component, an electronic component and a passive component. The conductive component is disposed between the first substrate and the second substrate, wherein the first substrate and the second substrate are separated from each other by an interval. The electronic component and the passive component are disposed within the interval.

20 Claims, 4 Drawing Sheets

SEMICONDUCTOR PACKAGE

This is a Continuation of U.S. application Ser. No. 17/005,528, filed Aug. 28, 2020, which claims the benefit of U.S. Provisional application Ser. No. 62/961,936, filed Jan. 16, 2020, the subject matters of which are incorporated herein by reference.

FIELD OF THE INVENTION

The invention relates to a semiconductor package, and more particularly to a semiconductor package including a passive component.

BACKGROUND OF THE INVENTION

Passive component are electronic components that do not generate electricity, but consume, store, and/or release electricity. Passive components include resistors, capacitors and inductors. In most circuits, the passive components are connected to active components, usually semiconductor devices, such as amplifiers and logic chips.

Thus, how to connect with the semiconductor devices for increasing transmission speed has become a prominent task for the industries.

SUMMARY OF THE INVENTION

In one embodiment of the invention, a semiconductor package is provided. The semiconductor package includes a first substrate, a second substrate, a conductive component, an electronic component and a passive component. The conductive component is disposed between the first substrate and the second substrate, wherein the first substrate and the second substrate are separated from each other by an interval. The electronic component is disposed within the interval. The passive component is disposed within the interval. The conductive component includes two ends connecting the first substrate with the second substrate respectively.

In another embodiment of the invention, a semiconductor package is provided. The semiconductor package includes a first substrate, a second substrate, a conductive component, an electronic component and a passive component. The first substrate includes a first outermost conductive layer. The second substrate includes a second outermost conductive layer. The conductive component is disposed between the first substrate and the second substrate, wherein the first substrate and the second substrate are separated from each other by an interval. The electronic component is disposed within the interval. The passive component is disposed within the interval, wherein the passive component is electrically connected with the electronic component through a conductive path traveling through the first outermost conductive layer, the conductive component and the second outermost conductive layer. The conductive component includes two ends connecting the first substrate with the second substrate respectively.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

Figure 1:
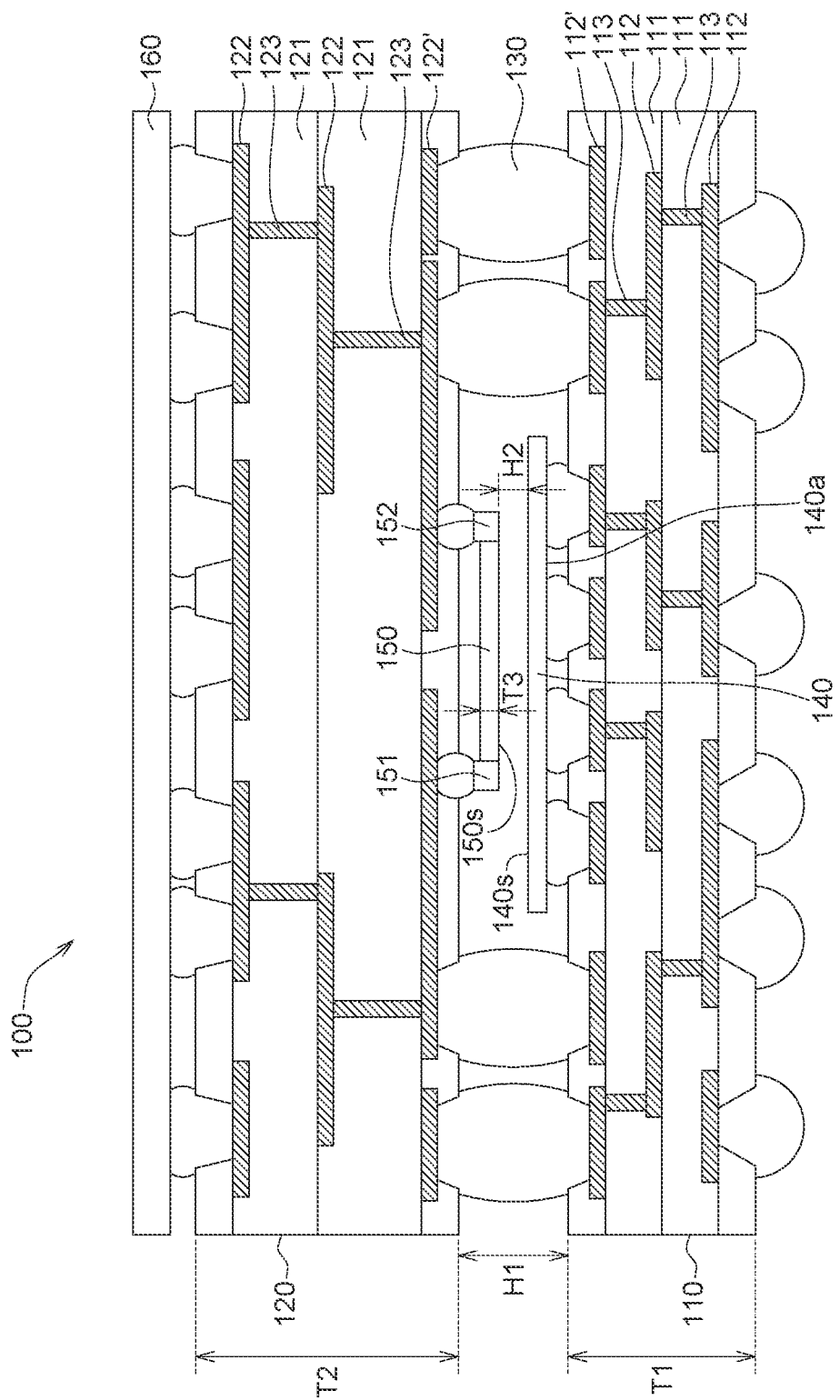
FIG. 1 illustrates a diagram view of a semiconductor package according to an embodiment of the invention.

Referring to FIG. 1, FIG. 1 illustrates a diagram view of a semiconductor package 100 according to an embodiment of the invention. The semiconductor package 100 could be applied to an electronic device, such as mobile phone, laptop computer, tablet computer, desktop computer, etc. The semiconductor package is, for example, a PoP (Package-On-Package) structure.

The semiconductor package 100 includes a first substrate 110, a second substrate 120, at least one conductive component 130, at least one electronic component 140 and at least one passive component 150. The conductive component 130 is disposed between the first substrate 110 and the second substrate 120, wherein the first substrate 110 and the second substrate 120 are separated from each other by an interval H1. The electronic component 140 and the passive component 150 both are disposed within the interval H1. As a result, the electronic component 140 and the passive component 150 could be electrically connected through a short (or shorter) conductive path, and accordingly it could increase transmission speed of signal between the electronic component 140 and the passive component 150.

In addition, the first substrate 110 has a thickness T1, and the second substrate 120 has a thickness T2, wherein the interval H1 could be less than the thickness T1 and/or the thickness T2. Thus, in compared with the passive component 150 being disposed on the first substrate 110 opposite to the electronic component 140 (vertical conductive path travels through the thickness T1), due to the passive component 150 being disposed on the second substrate 120 in FIG. 1, its vertical conductive path from the electronic component 140 to the passive component 150 is shorter.

In an embodiment, the interval H1 ranges, for example, between 100 micrometers and 270 micrometers. The passive component 150 has a thickness T3 ranging, for example, between 90 micrometers and 150 micrometers.

The first substrate 110 could be a single-layered structure or a multi-layered structure. In terms of multi-layered structure, the first substrate 110 includes a plurality of dielectric layers 111, at least one conductive layer 112 and at least one conductive via 113, wherein one conductive layer 112 is formed between adjacent two dielectric layers 111, and adjacent two conductive layers 112 are electrically connected with at least one conductive via 113. In the present embodiment, each conductive layer 112 extends in a first direction and includes at least one conductive trace and/or at least one conductive pad. The first direction is, for example, the extension direction of plane of the first substrate 110, for example, horizontal direction. The electronic component 140 and the passive component 150 could be electrically connected through the conductive layer 112.

In term of material, the conductive layer 112 and/or the conductive via 113 could be made of a material including, for example, copper, etc.

In the present embodiment, each conductive via 113 extends in a second direction. The second direction is substantially vertical to the first direction. The second direction is, for example, the extension direction of thickness of the first substrate 110, for example, vertical direction.

The second substrate 120 is, for example, an interposer. The second substrate 120 could be a single-layered structure or a multi-layered structure. In terms of multi-layered structure, the second substrate 120 includes a plurality of dielectric layers 121, at least one conductive layer 122 and at least one conductive via 123, wherein one conductive layer 122 is formed between adjacent two dielectric layers 121, and adjacent two conductive layers 122 are electrically connected with at least one conductive via 123. In the present embodiment, each conductive layer 122 extends in a third direction and includes at least one conductive trace and/or at least one conductive pad. In addition, the third direction is, for example, the extension direction of plane of the first substrate 120, for example, horizontal direction. The electronic component 140 and the passive component 150 could be electrically connected through the conductive layer 122.

In term of material, the conductive layer 122 and/or the conductive via 123 could be made of a material including, for example, copper, etc.

In the present embodiment, each conductive via 123 extends in a fourth direction. The fourth direction is substantially vertical to the third direction. The fourth direction is, for example, the extension direction of thickness of the second substrate 120, for example, vertical direction.

The conductive component 130 is, for example, solder ball. The electronic component 140 and the passive component 150 could be electrically connected through the conductive component 130.

In term of conductivity, conductivity of the conductive component 130 is, for example, lower than that of the conductive layer 112 and the conductive layer 122. In addition, the conductive component 130 electrically connects the first substrate 110 and the second substrate 120 in the second direction or fourth direction. As a result, the conductive layers 112 and 123 could increase the transmission speed between the electronic component 140 and the passive component 150.

The conductive layers 112 of the first substrate 110 includes a first outermost conductive layer 112', The conductive layers 122 of the second substrate 120 includes a second outermost conductive layer 122', the electronic component 140 is directly or in directly connected with the first outermost conductive layer 112', and the passive component 150 is directly or in directly connected with the second outermost conductive layer 122', wherein the conductive component 130 connects the first outermost conductive layer 112' and the second outermost conductive layer 122'. As a result, the passive component 150 is electrically connected with the electronic component 140 through the conductive path traveling through the first outermost conductive layer 112', the conductive component 130 and the second outermost conductive layer 122'. Due to the conductive path traveling through the outermost conductive layer, impedance loss is low and transmission speed of the signal in the conductive path is high. In addition, the conductive path mostly travels through the conductive layer having higher conductivity (higher than that of the conductive component 130), and thus the impedance loss is low and transmission speed in the conductive path is high.

In an embodiment, the electronic component 140 is, for example, logic chip, etc. In an embodiment, the passive component 150 is, for example, resistor, inductor and/or capacitor.

In the present embodiment, the electronic component 140 is disposed on the first substrate 110, and the passive component 150 is disposed on the second substrate, wherein the passive component 150 and the electronic component 140 are disposed in way of back-to-back. For example, the electronic component 140 has a first back surface 140s, and the passive component 150 has a second back surface 150s, wherein the first back surface 140s and the second back surface 150s face each other.

In another embodiment, the electronic component 140 is disposed on the second substrate 120, and the passive component 150 is disposed on the first substrate 110.

In addition, the electronic component 140 is, for example, a flip chip. For example, the electronic component 140 has an active surface 140a opposite to the first back surface 140s, wherein the active surface 140a faces the first substrate 110. The passive component 150 includes a first electrode 151 and a second electrode 152 which are electrically connected with the second outermost conductive layer 122'.

In the present embodiment, the first back surface 140s is separated from the second back surface 150s by space H2. As a result, it could avoid interference stress between the electronic component 140 and the passive component 150. In another embodiment, the first back surface 140s could be in contact with the second back surface 150s. As a result, a heat conduction channel (or path) is created between the first back surface 140s and the second back surface 150s.

In addition, as shown in FIG. 1, the semiconductor package 100 further includes at least one electronic device 160, for example, memory. The electronic device 160 is disposed on the second substrate 120. The electronic device 160 could be electrically connected with the passive component 150 through the conductive layers 122 and the conductive vias 123. In addition, the electronic device 160 could be electrically connected with the electronic component 140 through the conductive layers 122, the conductive vias 123 and the first outermost conductive layer 112'.

Figure 2:
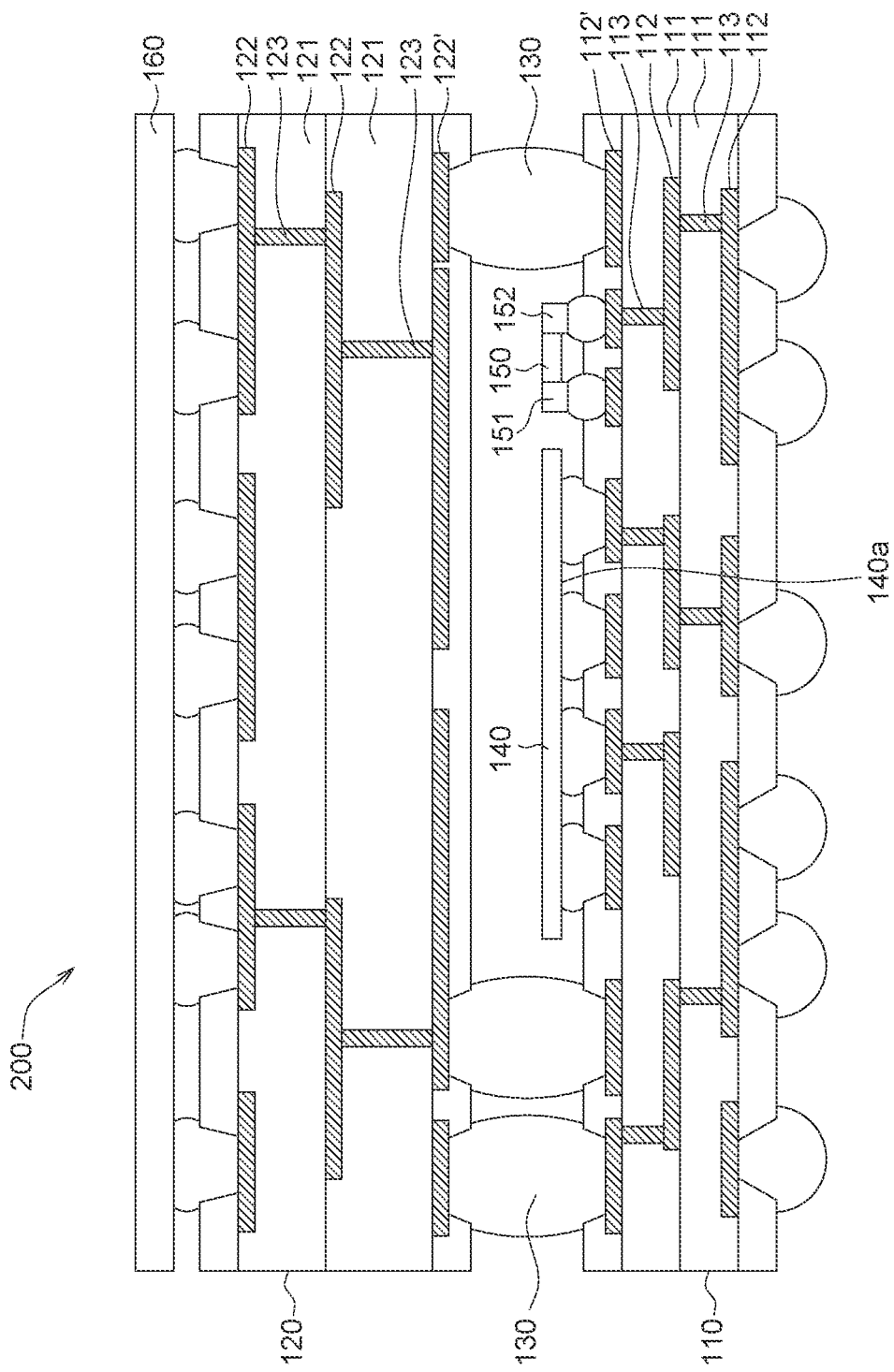
FIG. 2 illustrates a diagram view of a semiconductor package according to another embodiment of the invention.

Referring to FIG. 2, FIG. 2 illustrates a diagram view of a semiconductor package 200 according to another embodiment of the invention.

The semiconductor package 200 includes the first substrate 110, the second substrate 120, at least one conductive component 130, at least one electronic component 140, at least one passive component 150 and at least one electronic device 160.

The semiconductor package 200 includes the features the same as or similar to that of the semiconductor package 100 and difference is in that the passive component 150 and the electronic component 140 are disposed in way of side-by-side.

The electronic component 140 and the passive component 150 both are disposed on the first substrate 110. In another embodiment, the electronic component 140 and the passive component 150 could be both disposed on the second substrate 120.

In the present embodiment, the electronic component 140 has the active surface 140a facing the first substrate 110, and the passive component 150 includes the first electrode 151 and the second electrode 152 which are electrically connected with the first outermost conductive layer 112'.

In the present embodiment, the conductive layers 112 of the first substrate 110 includes the first outermost conductive layer 112', and the electronic component 140 and the passive component 150 are directly or indirectly connected with the first outermost conductive layer 112'.

Figure 3:
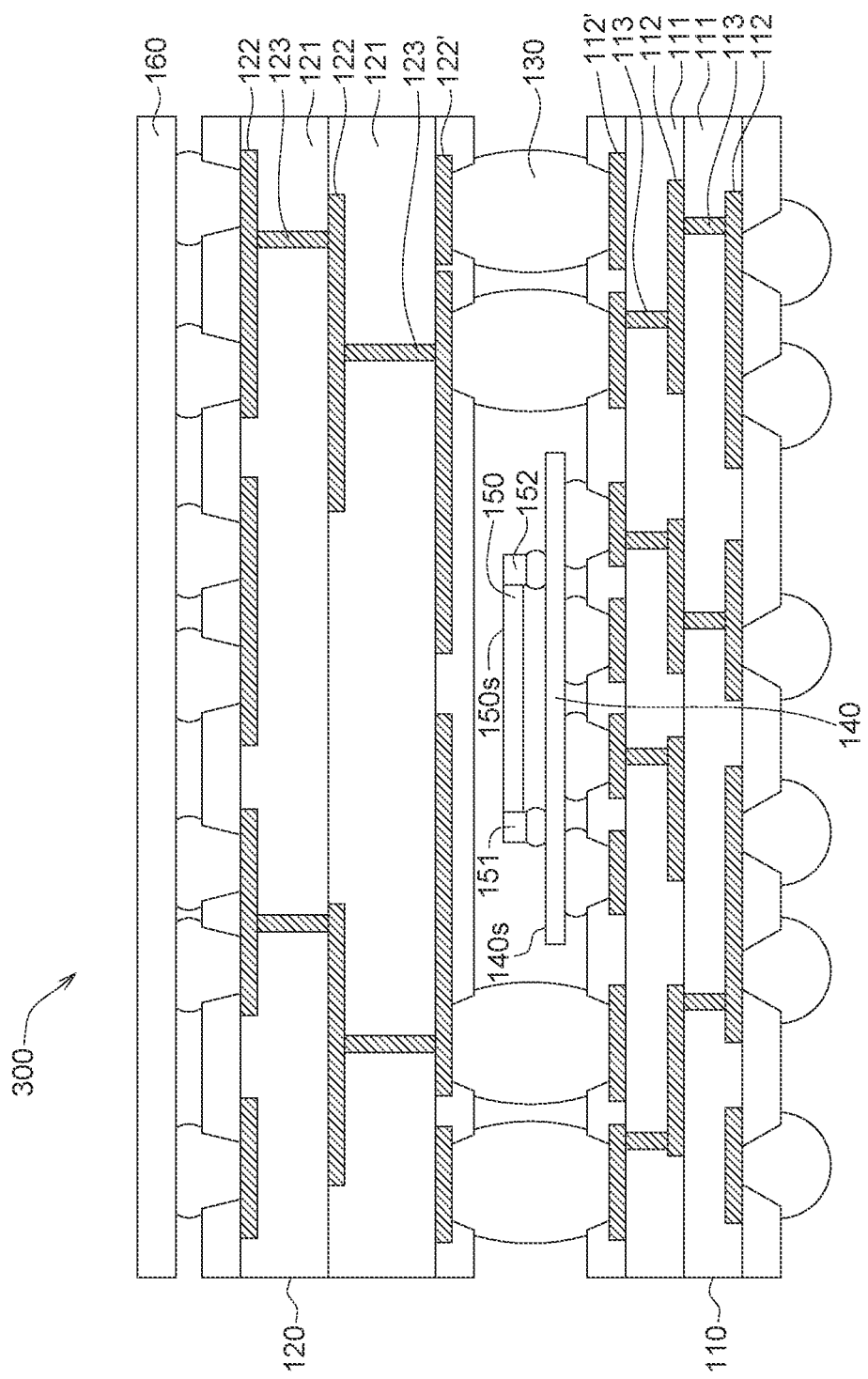
FIG. 3 illustrates a diagram view of a semiconductor package according to another embodiment of the invention.

Referring to FIG. 3, FIG. 3 illustrates a diagram view of a semiconductor package 300 according to another embodiment of the invention.

The semiconductor package 300 includes the first substrate 110, the second substrate 120, at least one conductive component 130, at least one electronic component 140, at least one passive component 150 and at least one electronic device 160.

The semiconductor package 300 includes the features the same as or similar to that of the semiconductor package 100 and difference is in that the passive component 150 is directly or indirectly disposed on the electronic component 140. As a result, the passive component 150 could be electrically connected with the electronic component 140 through a short (shorter or shortest) conductive path without traveling through the conductive layer 112 of the first substrate 110, the conductive layer 122 of the second substrate 120 and the conductive component 130.

In the present embodiment, the passive component 150 is disposed between the electronic component 140 and the second substrate 120. For example, the passive component 150 includes the first electrode 151 and the second electrode 152 which are disposed on the first back surface 140s (which faces the second substrate 120) of the electronic component 140 and electrically connected with the electronic component 140.

In addition, the second back surface 150s of the passive component 150 could be separated from the second substrate 120, or in contact with the second substrate 120.

Figure 4:
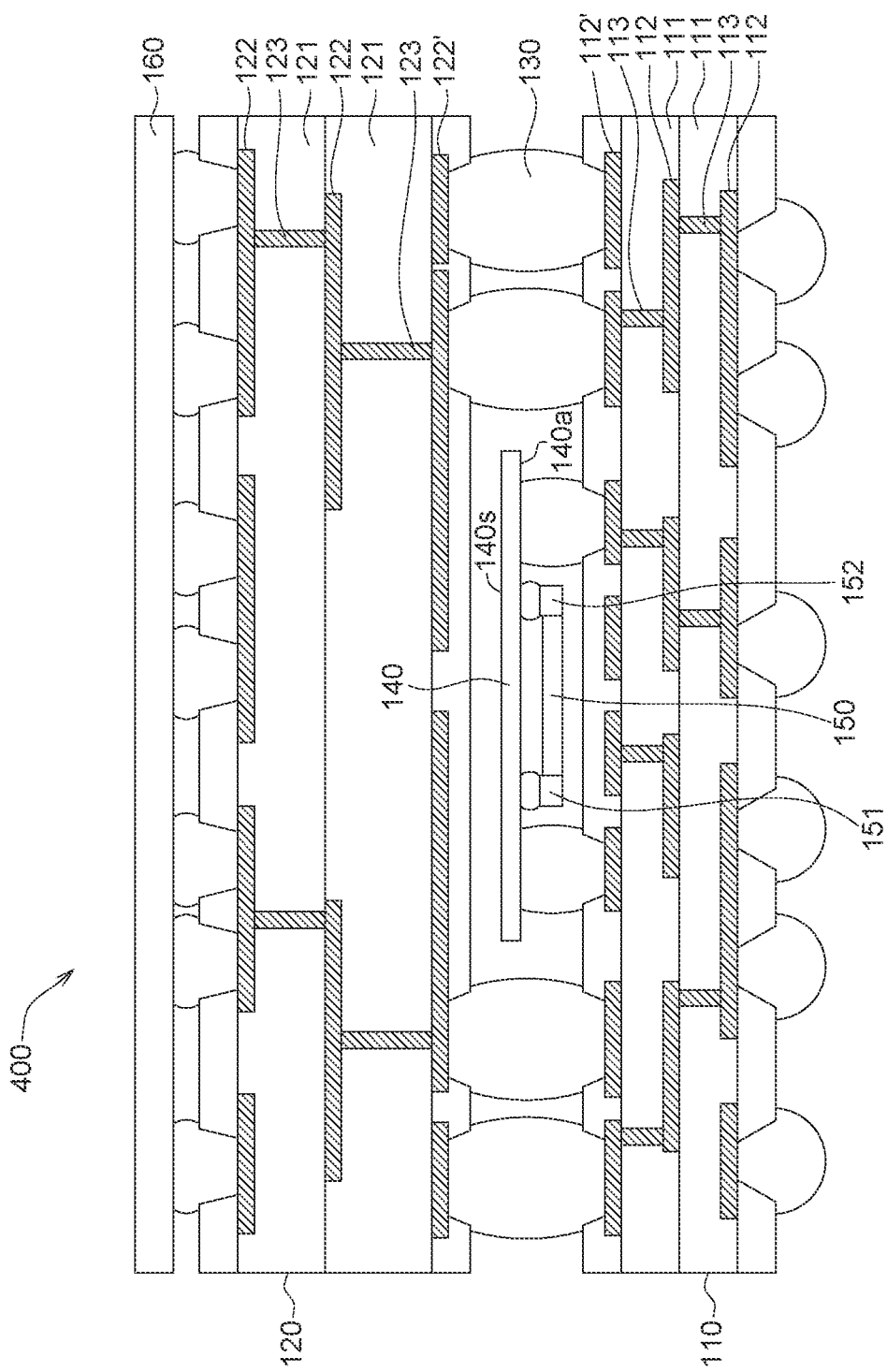
FIG. 4 illustrates a diagram view of a semiconductor package according to another embodiment of the invention.

Referring to FIG. 4, FIG. 4 illustrates a diagram view of a semiconductor package 400 according to another embodiment of the invention.

The semiconductor package 400 includes the first substrate 110, the second substrate 120, at least one conductive component 130, at least one electronic component 140, at least one passive component 150 and at least one electronic device 160.

The semiconductor package 400 includes the features the same as or similar to that of the semiconductor package 300 and difference is in that the passive component 150 is disposed between the electronic component 140 and the first substrate 110. For example, the passive component 150 includes the first electrode 151 and the second electrode 152 which are disposed on the active surface 140a (which facing the first substrate 110) of the electronic component 140 and electrically connected with the electronic component 140.

In addition, the first back surface 140s of the electronic component 140 could be separated from the second substrate 120, or in contact with the second substrate 120.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor package, comprises:
   a first substrate;
   a second substrate;
   a conductive component disposed between the first substrate and the second substrate, wherein the first substrate and the second substrate are separated from each other by an interval;
   an electronic component disposed within the interval; and
   a passive component disposed within the interval;
   wherein the conductive component comprises two ends connecting the first substrate with the second substrate respectively;
   wherein the passive component is stacked on the electronic component in a thickness direction, and the electronic component is a logic chip.

2. The semiconductor package as claimed in claim 1, wherein the electronic component is disposed on one of the first substrate and the second substrate, and the passive component is disposed on another of the first substrate and the second substrate.

3. The semiconductor package as claimed in claim 2, wherein the electronic component has a first back surface, the passive component has a second back surface, and the first back surface and the second back surface face each other.

4. The semiconductor package as claimed in claim 3, wherein the first back surface contacts the second back surface.

5. The semiconductor package as claimed in claim 3, wherein the first back surface is separated from the second back surface.

6. The semiconductor package as claimed in claim 2, wherein the electronic component is disposed on the first substrate and has an active surface facing the first substrate, and the passive component is disposed on the second substrate.

7. The semiconductor package as claimed in claim 2, wherein the first substrate comprises a first outermost conductive layer, the second substrate comprises a second outermost conductive layer, the electronic component is connected with the first outermost conductive layer, the passive component is connected with the second outermost conductive layer, and the conductive component connects the first outermost conductive layer and the second outermost conductive layer.

8. The semiconductor package as claimed in claim 1, wherein the electronic component and the passive component are disposed on one of the first substrate and the second substrate.

9. The semiconductor package as claimed in claim 8, wherein the electronic component and the passive component are disposed on the first substrate, and the passive component has an active surface facing the first substrate.

10. The semiconductor package as claimed in claim 8, wherein the first substrate comprises a first outermost conductive layer, and the electronic component and the passive component are connected with the first outermost conductive layer.

11. The semiconductor package as claimed in claim 1, wherein the first substrate has a thickness, and the interval is less than the thickness.

12. The semiconductor package as claimed in claim 1, wherein the passive component is disposed within the electronic component.

13. The semiconductor package as claimed in claim 1, wherein the passive component is disposed between the electronic component and the second substrate.

14. The semiconductor package as claimed in claim 13, wherein the electronic component has a back surface facing the second surface, and the passive component is disposed on the back surface of the electronic component.

15. The semiconductor package as claimed in claim 1, wherein the passive component is disposed between the electronic component and the first substrate.

16. The semiconductor package as claimed in claim 15, wherein the electronic component has an active surface facing the first surface, and the passive component is disposed on the active surface of the electronic component.

17. The semiconductor package as claimed in claim 1, wherein the electronic component is a logic chip.

18. The semiconductor package as claimed in claim 1, wherein the interval ranges between 100 micrometers and 270 micrometers.

19. The semiconductor package as claimed in claim 1, wherein the passive component has a thickness ranging between 90 micrometers and 150 micrometers.

20. A semiconductor package, comprising:
   a first substrate comprising a first outermost conductive layer;
   a second substrate comprising a second outermost conductive layer;
   a conductive component disposed between the first substrate and the second substrate, wherein the first substrate and the second substrate are separated from each other by an interval;
   an electronic component disposed within the interval; and
   a passive component disposed within the interval, wherein the passive component is electrically connected with the electronic component through a conductive path traveling through the first outermost conductive layer, the conductive component and the second outermost conductive layer;
   wherein the conductive component comprises two ends connecting the first substrate with the second substrate respectively;
   wherein the passive component is stacked on the electronic component in a thickness direction, and the electronic component is a logic chip.

* * * * *